(12) United States Patent
Chang et al.

(10) Patent No.: US 12,113,082 B2
(45) Date of Patent: Oct. 8, 2024

(54) SENSOR PACKAGE STRUCTURE

(71) Applicant: KINGPAK TECHNOLOGY INC., Hsin-Chu County (TW)

(72) Inventors: Ya-Han Chang, Hsin-Chu County (TW); Li-Chun Hung, Hsin-Chu County (TW); Chien-Chen Lee, Hsin-Chu County (TW)

(73) Assignee: TONG HSING ELECTRONIC INDUSTRIES, LTD., Taipei (TW)

( * ) Notice: Subject to any disclaimer, the term of this patent is extended or adjusted under 35 U.S.C. 154(b) by 437 days.

(21) Appl. No.: 17/717,223

(22) Filed: Apr. 11, 2022

(65) Prior Publication Data
US 2023/0207590 A1 Jun. 29, 2023

(30) Foreign Application Priority Data
Dec. 28, 2021 (TW) .................. 110149017

(51) Int. Cl.
*H01L 27/146* (2006.01)
*H01L 23/00* (2006.01)

(52) U.S. Cl.
CPC ........ *H01L 27/14621* (2013.01); *H01L 24/05* (2013.01); *H01L 24/48* (2013.01); *H01L 27/14618* (2013.01); *H01L 27/14627* (2013.01); *H01L 2224/05026* (2013.01); *H01L 2224/48228* (2013.01)

(58) Field of Classification Search
CPC ..... H01L 2224/05026; H01L 27/14621; H01L 27/14627; H01L 27/14636
See application file for complete search history.

(56) References Cited

U.S. PATENT DOCUMENTS

| | | | | |
|---|---|---|---|---|
| 9,368,535 | B2* | 6/2016 | Skeete | H01L 27/14634 |
| 10,510,797 | B2* | 12/2019 | Chiang | H01L 27/14629 |
| 10,868,062 | B2* | 12/2020 | Lee | H01L 27/14623 |
| 11,133,348 | B2* | 9/2021 | Hung | H01L 27/14618 |
| 2019/0341428 | A1* | 11/2019 | Lee | H10K 59/40 |
| 2020/0105809 | A1* | 4/2020 | Lee | D21H 27/10 |
| 2020/0350357 | A1* | 11/2020 | Hung | H01L 27/14683 |

* cited by examiner

*Primary Examiner* — Jaehwan Oh
(74) *Attorney, Agent, or Firm* — Li & Cai Intellectual Property (USA) Office

(57) ABSTRACT

A sensor package structure is provided and includes a substrate, a sensor chip disposed on and electrically coupled to the substrate, a ring-shaped support disposed on the sensor chip, and a light-permeable layer disposed on the ring-shaped support. A top portion of the sensor chip defines a sensing region and a carrying region that surrounds the sensing region and that carries the ring-shaped support. The top portion of the sensor chip includes a passivation layer arranged in the sensing region and the carrying region, a color filter arranged in the sensing region and the carrying region, a pixel layer arranged in the sensing region and formed on the central segment, and a micro-lens layer that is formed on the pixel layer. A part of the color filter layer in the carrying region has a roughened surface and at least partially embedded in the ring-shaped support.

10 Claims, 13 Drawing Sheets

SENSOR PACKAGE STRUCTURE

CROSS-REFERENCE TO RELATED PATENT APPLICATION

This application claims the benefit of priority to Taiwan Patent Application No. 110149017, filed on Dec. 28, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure, and more particularly to a sensor package structure.

BACKGROUND OF THE DISCLOSURE

A conventional sensor package structure includes a glass sheet, a sensor chip, and an adhesive layer that adheres the glass sheet to the sensor chip. Since a structural change of the sensor chip can easily affect a sensing result, development of the conventional sensor package structure mostly aim at improving the adhesive layer to reinforce the connection between at least one component and the adhesive layer. However, the improvement of the adhesive layer has material limitations.

SUMMARY OF THE DISCLOSURE

In response to the above-referenced technical inadequacies, the present disclosure provides a sensor package structure to effectively improve on the issues associated with conventional sensor package structures.

In one aspect, the present disclosure provides a sensor package structure, which includes a substrate, a sensor chip, a ring-shaped support, and a light-permeable layer. The sensor chip is disposed on and electrically coupled to the substrate. Moreover, a top portion of the sensor chip defines a sensing region and a carrying region that surrounds the sensing region. The top portion of the sensor chip includes a passivation layer, a color filter layer, a pixel layer, and a micro-lens layer. The passivation layer is arranged in the sensing region and the carrying region. The color filter layer includes a central segment arranged in the sensing region and a peripheral segment that is arranged in the carrying region and that has a roughened surface. The pixel layer is arranged in the sensing region and is formed on the central segment. The micro-lens layer is arranged in the sensing region and is formed on the pixel layer. The ring-shaped support is formed on the carrying region of the sensor chip. At least part of the peripheral segment of the color filter layer is embedded in the ring-shaped support. The light-permeable layer is disposed on the ring-shaped support, and the light-permeable layer, the ring-shaped support, and the sensor chip jointly define an enclosed space.

Therefore, in the sensor package structure provided by the present disclosure, connection between the ring-shaped support and the sensor chip can be reinforced through the color filter layer having the roughened surface, thereby effectively preventing separation between the ring-shaped support and the sensor chip.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
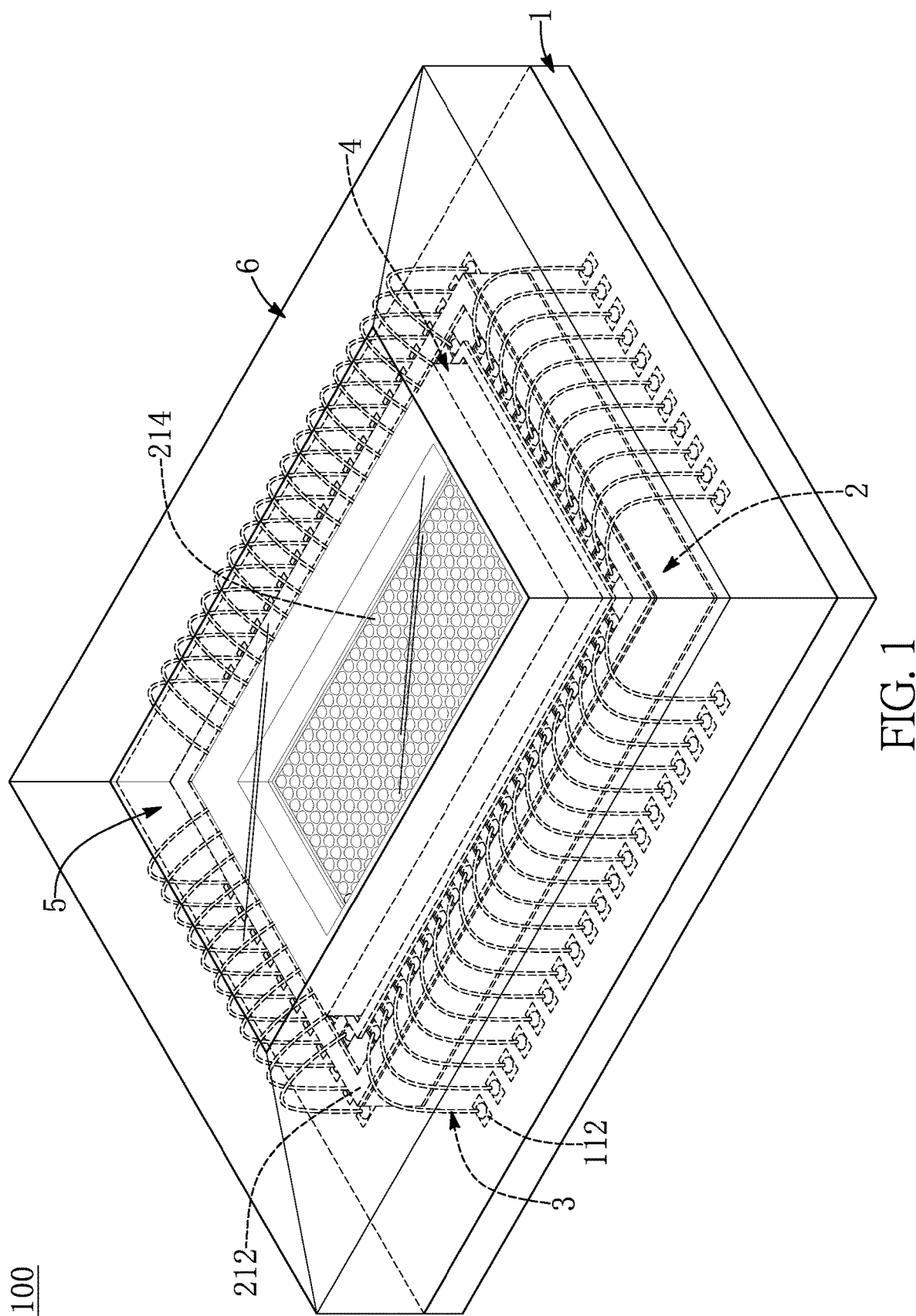
FIG. 1 is a perspective view of a sensor package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 8, a first embodiment of the present disclosure provides a sensor package structure 100. In other words, any package structure not encapsulating a sensor chip therein has a structural design different from that of the sensor package structure 100 of the present embodiment.

Figure 2:
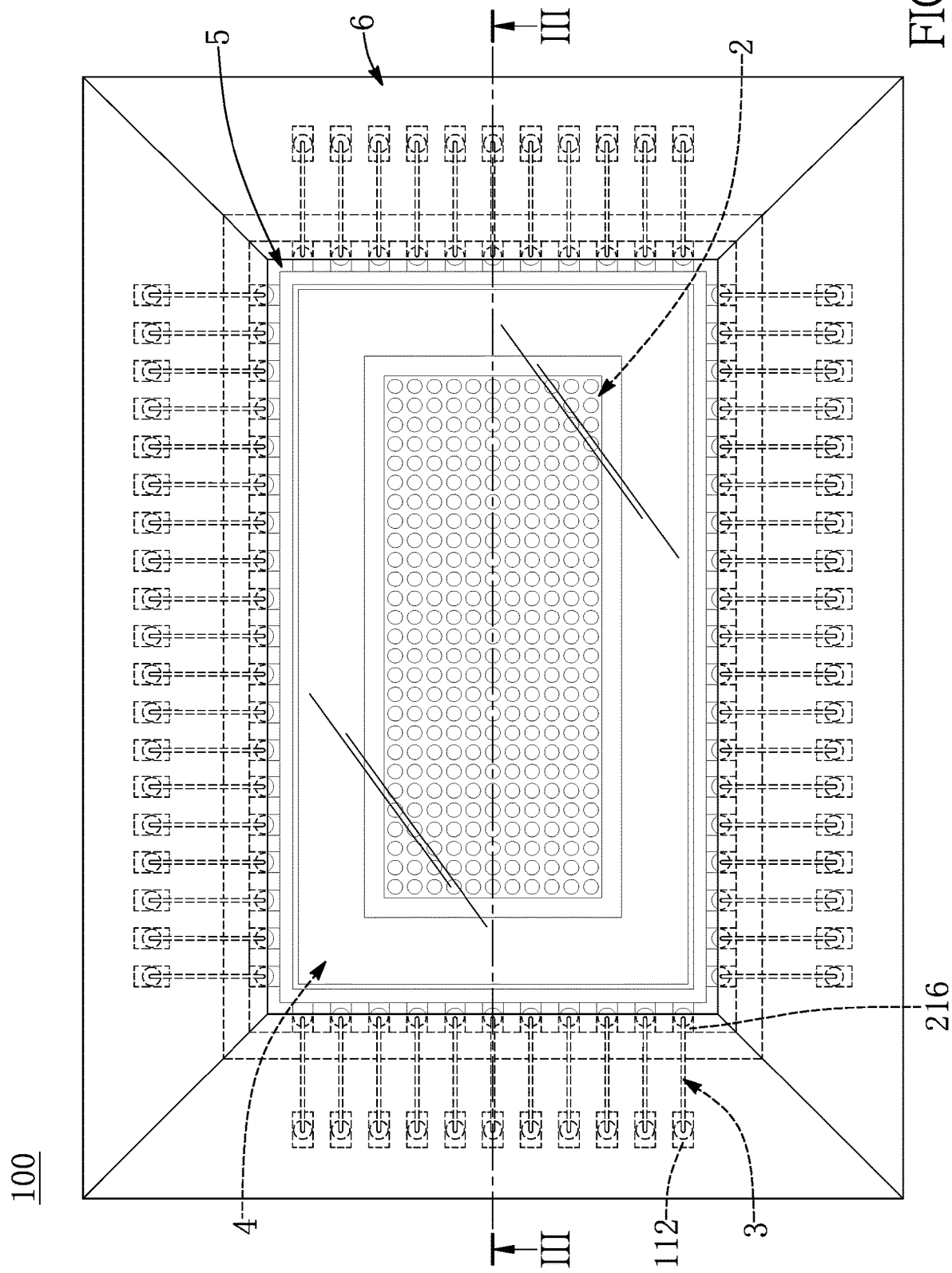
FIG. 2 is a top view of FIG. 1.
Figure 3:
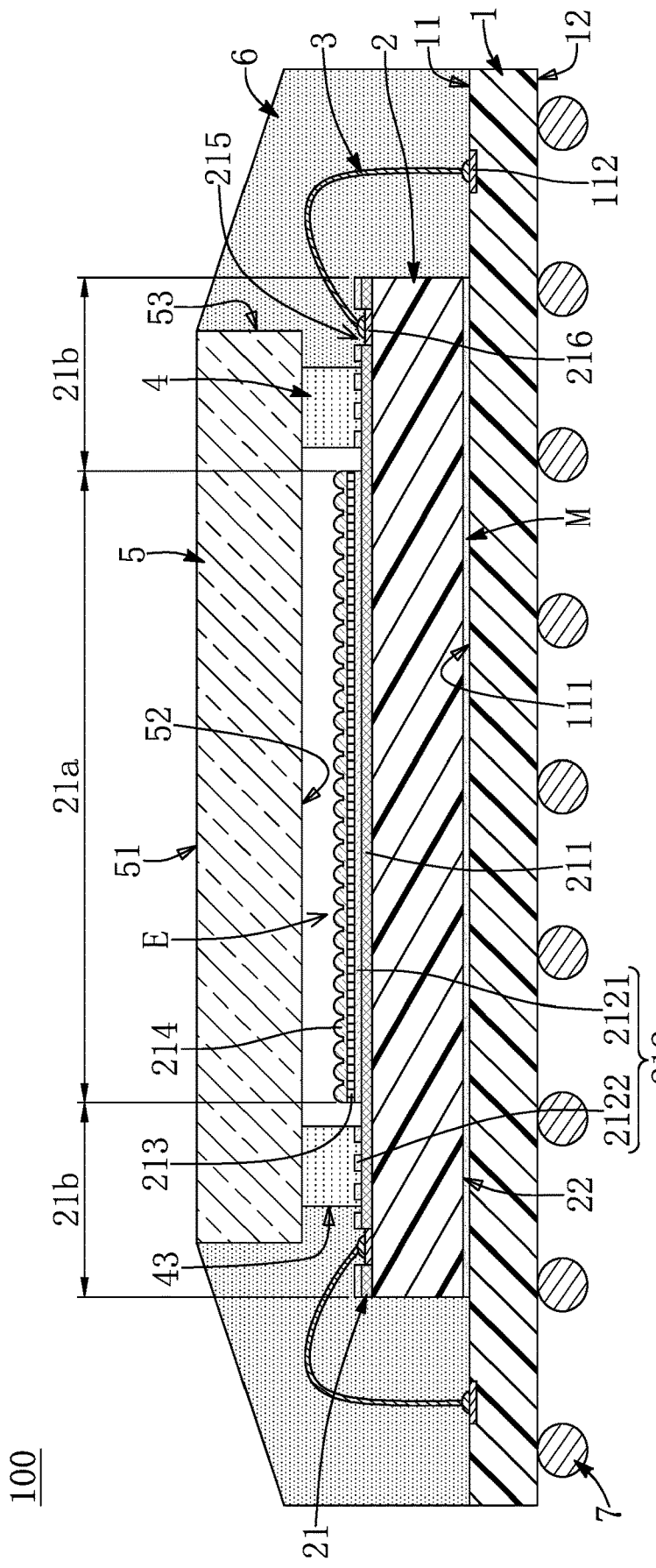
FIG. 3 is a cross-sectional view taken along line III-III of FIG. 2.
Figure 4:
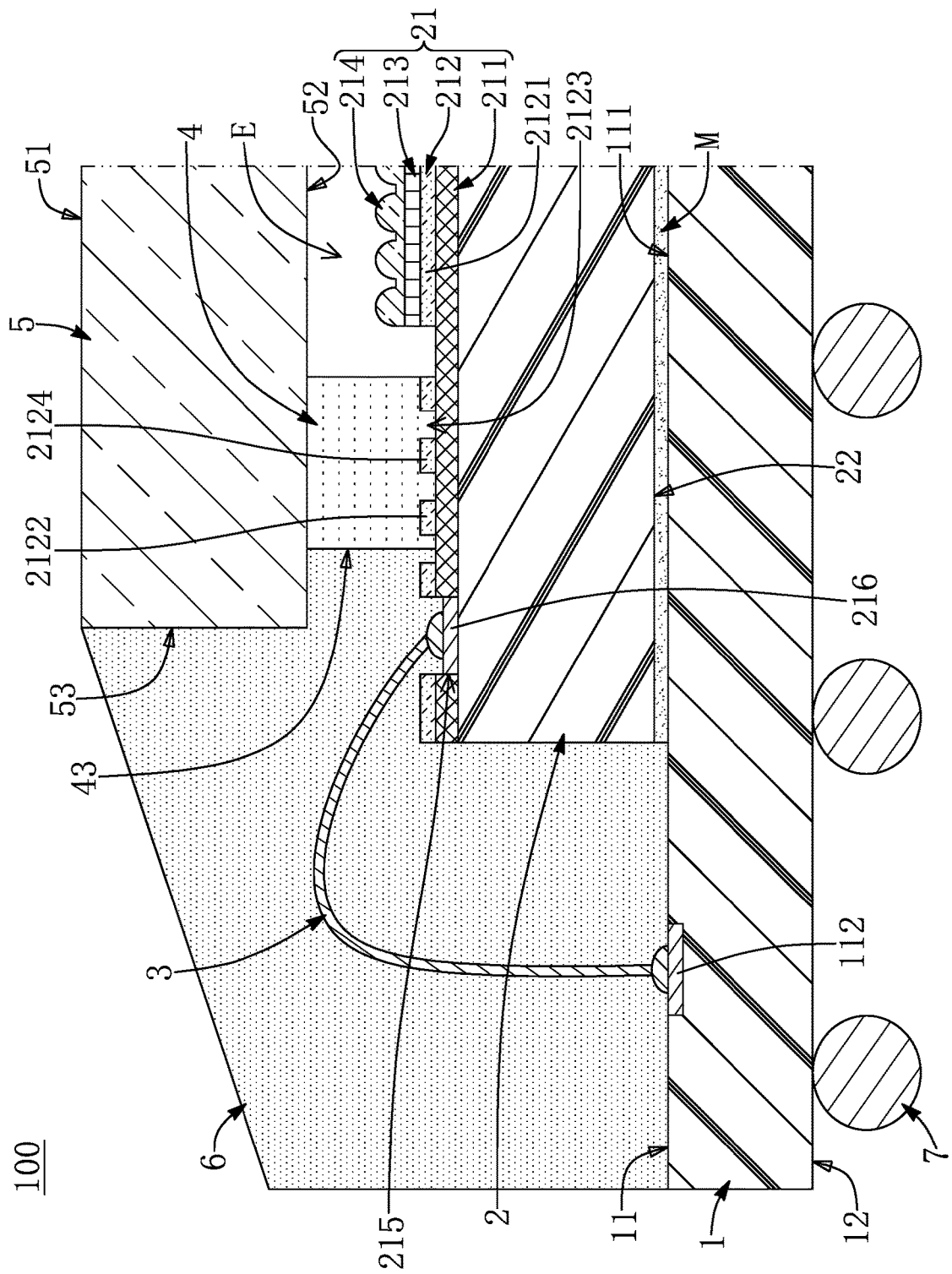
FIG. 4 is an enlarged view of a portion of FIG. 3.

As shown in FIG. 2 to FIG. 4, the sensor package structure 100 includes a substrate 1, a sensor chip 2 disposed on and electrically coupled to the substrate 1, a plurality of metal wires 3 electrically coupling the sensor chip 2 and the substrate 1, a ring-shaped support 4 disposed on the sensor chip 2, a light-permeable layer 5 disposed on the ring-shaped support 4, and an encapsulating body 6 that is formed on the substrate 1.

The sensor package structure 100 in the present embodiment includes the above components, but can be adjusted or changed according to design requirements. For example, in other embodiments of the present disclosure not shown in the drawings, the sensor package structure 100 can be provided without the metal wires 3, and the sensor chip 2 is fixed onto and electrically coupled to the substrate 1 in a flip-chip manner; or, the encapsulating body 6 of the sensor package structure 100 can be omitted or can be replaced by other structural designs. The structural and connection relationship of each component of the sensor package structure 100 will be recited in the following description.

The substrate 1 of the present embodiment is a square-shaped printed circuit board (PCB) or a rectangular PCB, but the present disclosure is not limited thereto. An upper board surface 11 of the substrate 1 includes a chip-bonding region 111 arranged approximately on a center portion thereof, and the substrate 1 includes a plurality of bonding pads 112 that are disposed on the upper board surface 11 and that are arranged outside of the chip-bonding region 111 (or the sensor chip 2). The bonding pads 112 in the present embodiment are in an annular arrangement, but the present disclosure is not limited thereto. For example, in other embodiments of the present disclosure not shown in the drawings, the bonding pads 112 can be arranged in two rows respectively at two opposite sides of the chip-bonding region 111.

In addition, the sensor package structure 100 can further include a plurality of solder balls 7 disposed on a lower board surface 12 of the substrate 1. The sensor package structure 100 can be soldered onto an electronic component (not shown in the drawings) through the solder balls 7, thereby electrically connecting the sensor package structure 100 to the electronic component.

The sensor chip 2 in the present embodiment is an image sensing chip, but the present disclosure is not limited thereto. A bottom surface 22 of the sensor chip 2 is fixed onto the chip-bonding region 111 of the substrate 1. In other words, the sensor chip 2 is arranged to be surrounded on the inside of the bonding pads 112. It should be noted that the sensor package structure 100 in the present embodiment includes an adhesive M (e.g., a thermally conductive adhesive), and the sensor chip 2 is fixed to the chip-bonding region 13 through the adhesive M (e.g., the bottom surface 22 of the sensor chip 2 is adhered to the chip-bonding region 13 through the adhesive M), but the present disclosure is not limited thereto. For example, in other embodiments of the present disclosure not shown in the drawings, the adhesive M can be omitted or can be replaced by other components.

Moreover, a top portion 21 of the sensor chip 2 defines a sensing region 21a and a carrying region 21b that is in a ringed shape and that surrounds the sensing region 21a. The sensor chip 2 includes a plurality of connection pads 216 arranged in the carrying region 21b. The quantity and positions of the connection pads 216 of the sensor chip 2 in the present embodiment correspond to those of the bonding pads 112 of the substrate 1.

Furthermore, one end of each of the metal wires 3 is connected to one of the bonding pads 112, and another end of each of the metal wires 3 is connected to one of the connection pads 216, so that the substrate 1 and the sensor chip 2 can be electrically coupled to each other through the metal wires 3.

Specifically, the top portion 21 of the sensor chip 2 in the present embodiment includes a passivation layer 211, a color filter layer 212, a pixel layer 213, and a micro-lens layer 214, which are sequentially arranged along a direction away from the substrate 1.

The passivation layer 211 is arranged in the sensing region 21a and the carrying region 21b. The color filter layer 212 includes a central segment 2121 arranged in the sensing region 21a and a peripheral segment 2122 that is arranged in the carrying region 21b and that has a roughened surface. The pixel layer 213 is arranged in the sensing region 21a and is formed on the central segment 2121. The micro-lens layer 214 is arranged in the sensing region 21a and is formed on the pixel layer 213.

Moreover, the ring-shaped support 4 in the present embodiment is an epoxy layer, and the ring-shaped support 4 is formed on the carrying region 21b of the sensor chip 2. At least part of the peripheral segment 2122 of the color filter layer 212 is embedded in the ring-shaped support 4, so that connection between the ring-shaped support 4 and the sensor chip 2 can be reinforced through the color filter layer 212 having the roughened surface, thereby effectively preventing the ring-shaped support 4 and the sensor chip 2 from being separated from each other.

It should be noted that the color filter layer 212, the pixel layer 213, and the micro-lens layer 214 of the sensor chip 2 are arranged above the passivation layer 211 and belong to optical components. Accordingly, the sensor package structure 100 of the present embodiment is provided to reinforce the connection between the ring-shaped support 4 and the sensor chip 2 by structural design of the color filter layer 212 belonging to the optical component. In other words, any package structure that does not change the structural design of the optical component for reinforcing component connection is different from the sensor package structure 100.

Specifically, the roughened surface of the peripheral segment 2122 of the color filter layer 212 provided by the present embodiment can be adjusted or changed according to design requirements. In order to clearly explain the present embodiment, the following description describes the color filter layer 212 in some possible configurations that provide better connection effect, but the present disclosure is not limited thereto.

Figure 5:
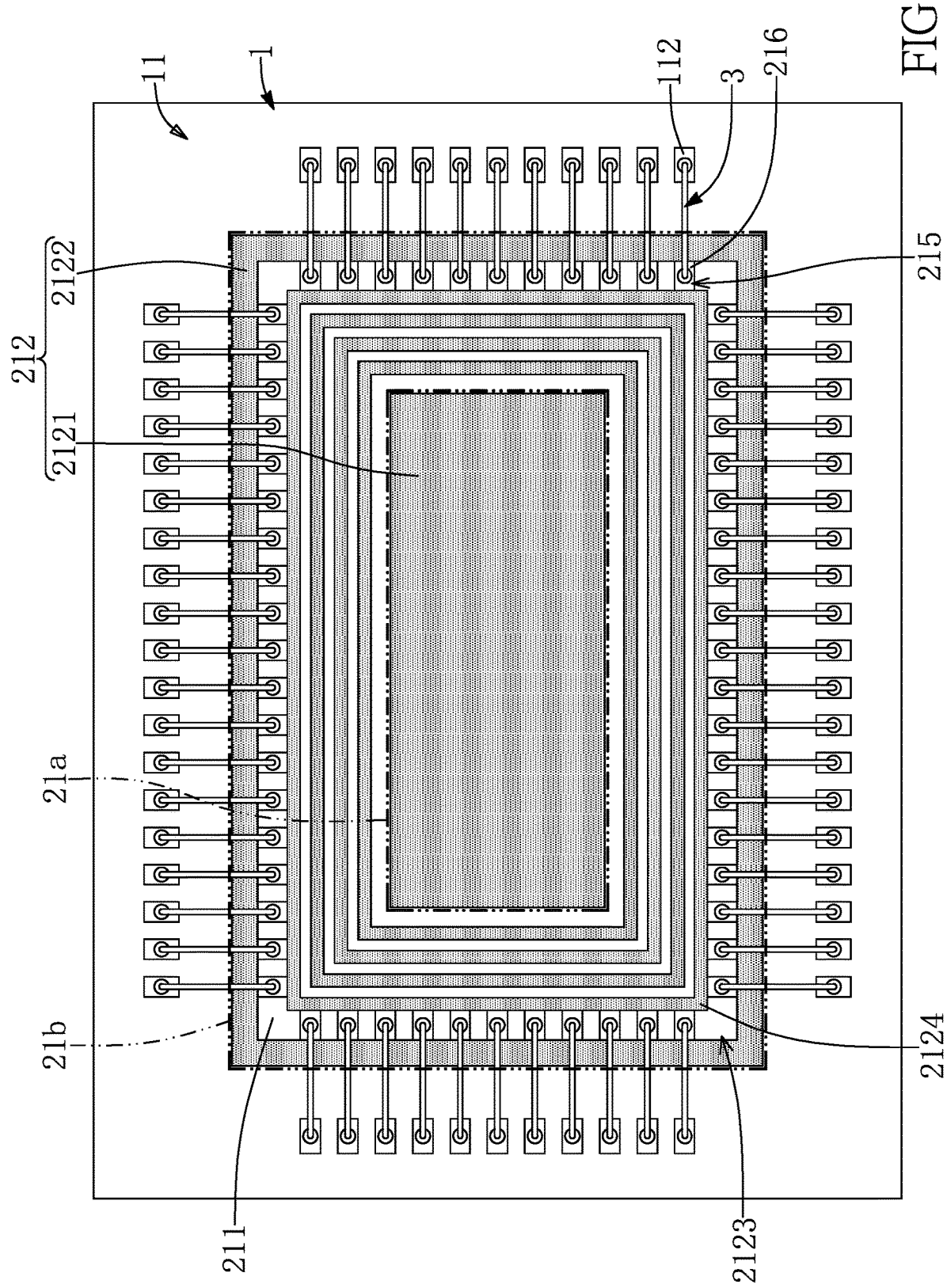
FIG. 5 is a top view of FIG. 1 when a ring-shaped support, a pixel layer and a micro-lens layer of a sensor chip, a light-permeable layer, and an encapsulating layer are omitted.

As shown in FIG. 3 to FIG. 5, the color filter layer 212 has a plurality of ring-shaped slots 2123 that are recessed in the peripheral segment 2122 so as to form the roughened surface. Each of the ring-shaped slots 2123 surrounds the central segment 2121, and center points of the ring-shaped slots 2123 preferably overlap with each other so as to be in a concentric arrangement. Moreover, the ring-shaped support 4 can be disposed on at least one of the ring-shaped slots 2123; that is to say, at least one of the ring-shaped slots 2123 is fully filled with the ring-shaped support 4.

Specifically, each of the ring-shaped slots 2123 in the present embodiment penetrates through the peripheral segment 2122, so that the peripheral segment 2122 is divided into a plurality of ring-shaped ribs 2124 spaced apart from each other, and the ring-shaped support 4 can be disposed on at least one of the ring-shaped slots 2123. In other words, the ring-shaped support 4 is connected to the passivation layer 211 by passing through at least one of the ring-shaped slots 2123, but the present disclosure is not limited thereto. For example, in other embodiments of the present disclosure not shown in the drawings, any one of the ring-shaped slots 2123 can be formed without penetrating through the peripheral segment 2122, and the ring-shaped support 4 and the passivation layer 211 are separate from each other through the peripheral segment 2122 of the color filter layer 212.

Figure 6:
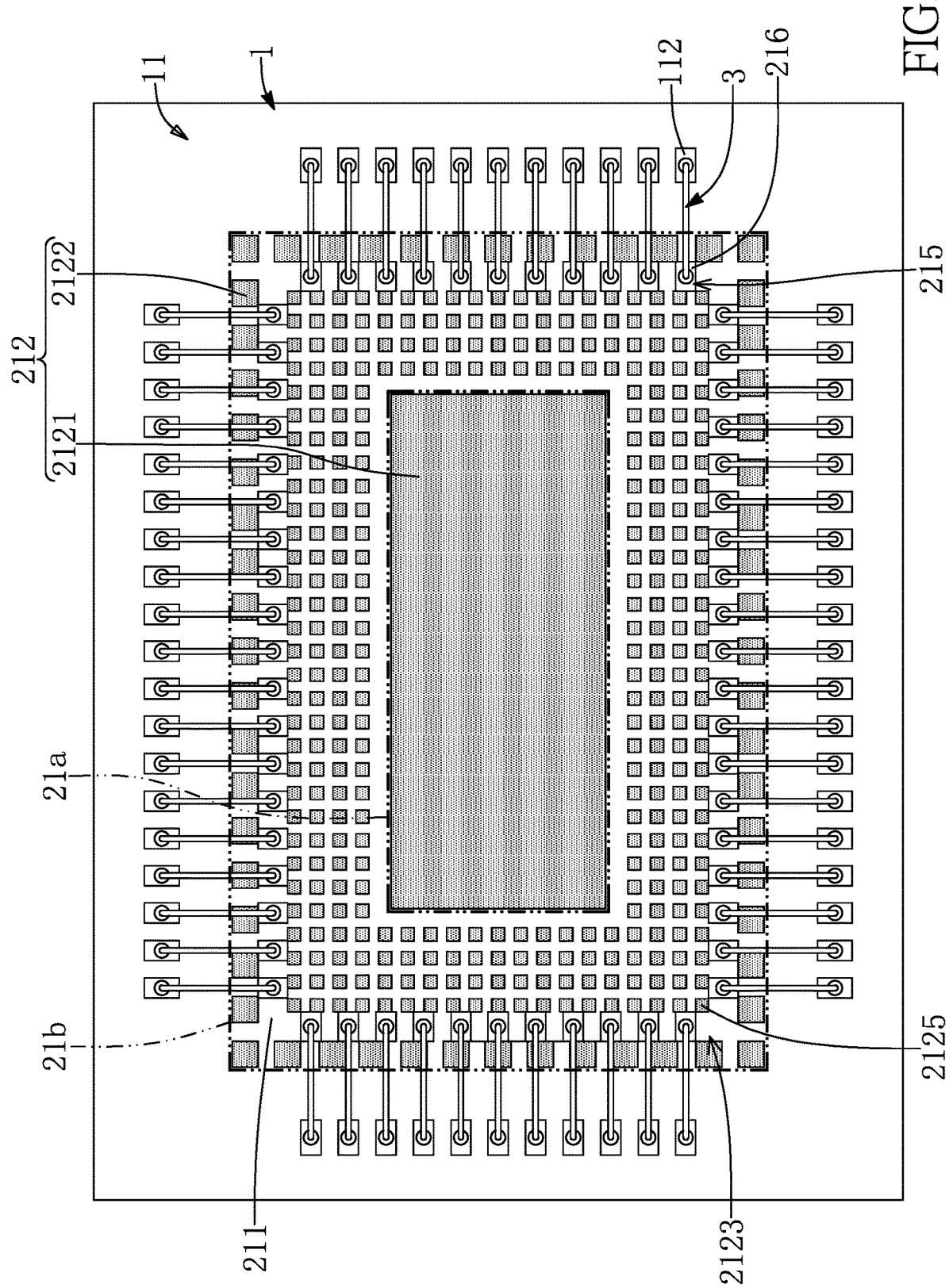
FIG. 6 is a planar view showing FIG. 5 when a color filter layer is in another configuration of the sensor package structure according to the first embodiment of the present disclosure.
Figure 7:
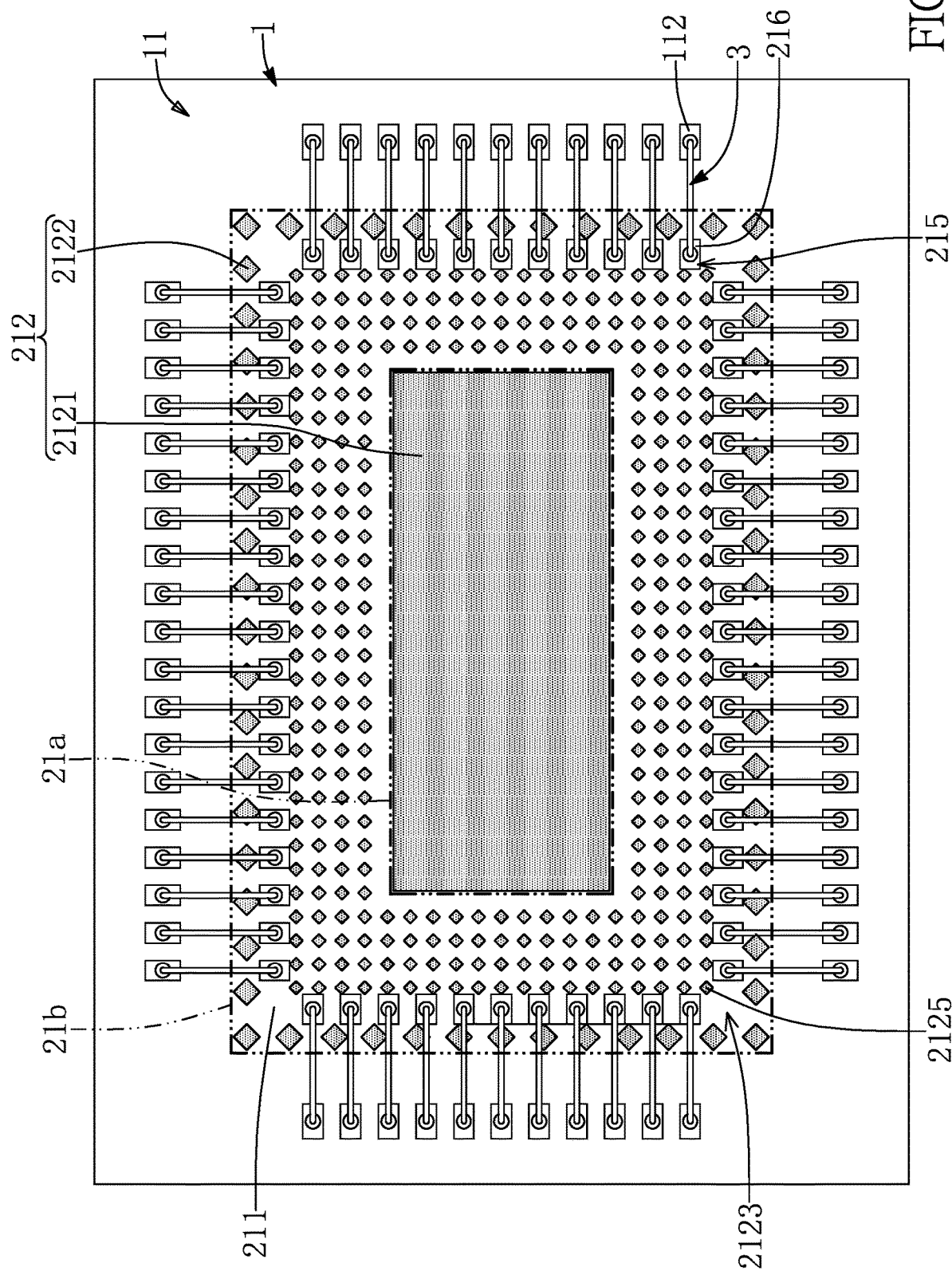
FIG. 7 is a planar view showing FIG. 5 when the color filter layer is in still another configuration of the sensor package structure according to the first embodiment of the present disclosure.

As shown in FIG. 6 and FIG. 7, the peripheral segment 2122 of the color filter layer 212 in the present embodiment has a plurality of protrusions 2125 that are spaced apart from each other so as to form the roughened surface. The protrusions 2125 are arranged around the central segment 2121, and at least part of the protrusions 2125 are embedded in the ring-shaped support 4, an arrangement that is similar to that in FIG. 4. It should be noted that the ring-shaped support 4 in the present embodiment is in direct contact with the passivation layer 211, but the present disclosure is not limited thereto. For example, in other embodiments of the present disclosure not shown in the drawings, the peripheral segment 2122 of the color filter layer 212 can have a thin film disposed on the passivation layer 211, and the protrusions 2125 are formed on the thin film, so that the ring-shaped support 4 and the passivation layer 211 are separate from each other through the thin film of the color filter layer 212.

Moreover, the shape of each of the protrusions 2125 can be adjusted or changed according to design requirements. For example, the shape of each of the protrusions 2125 can be a cube or a cuboid as shown in FIG. 6, or can be a rhombus as shown in FIG. 7, but the present disclosure is not limited thereto.

In addition, as shown in FIG. 3 to FIG. 5, the sensor chip 2 has at least one accommodating slot 215 that is recessed in the carrying region 21b and that penetrates through the peripheral segment 2122 and the passivation layer 211, and the connection pads 216 are located in the at least one accommodating slot 215. In other words, a quantity of the at least one accommodating slot 215 can be only one, and the accommodating slot 215 is in a ringed shape for receiving the connection pads 216; or, the quantity of the at least one accommodating slot 215 can be more than one, and the connection pads 216 are respectively arranged in the accommodating slots 215.

Figure 8:
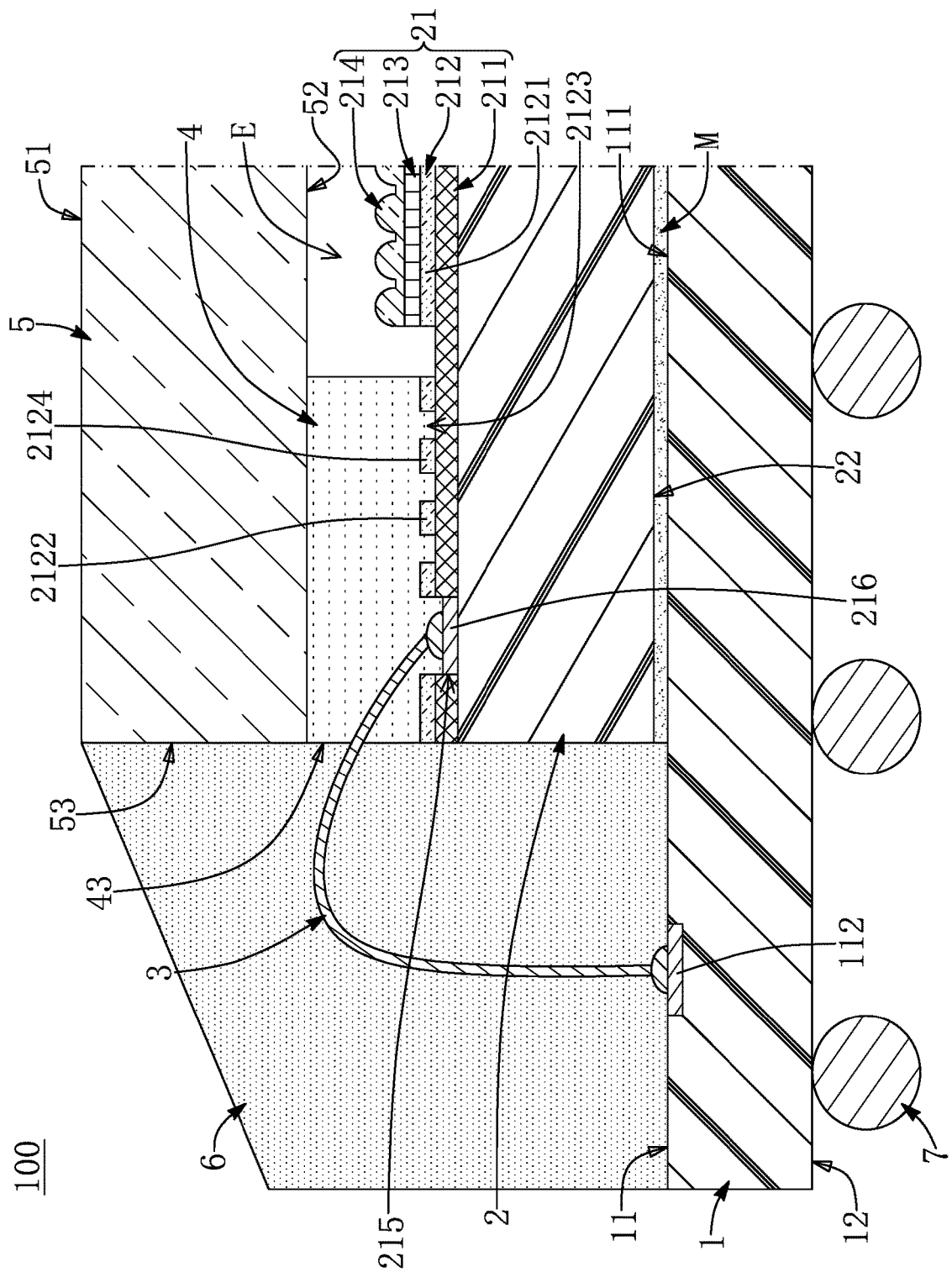
FIG. 8 is an enlarged view showing the portion of FIG. 3 when the ring-shaped support is in another configuration.
Figure 9:
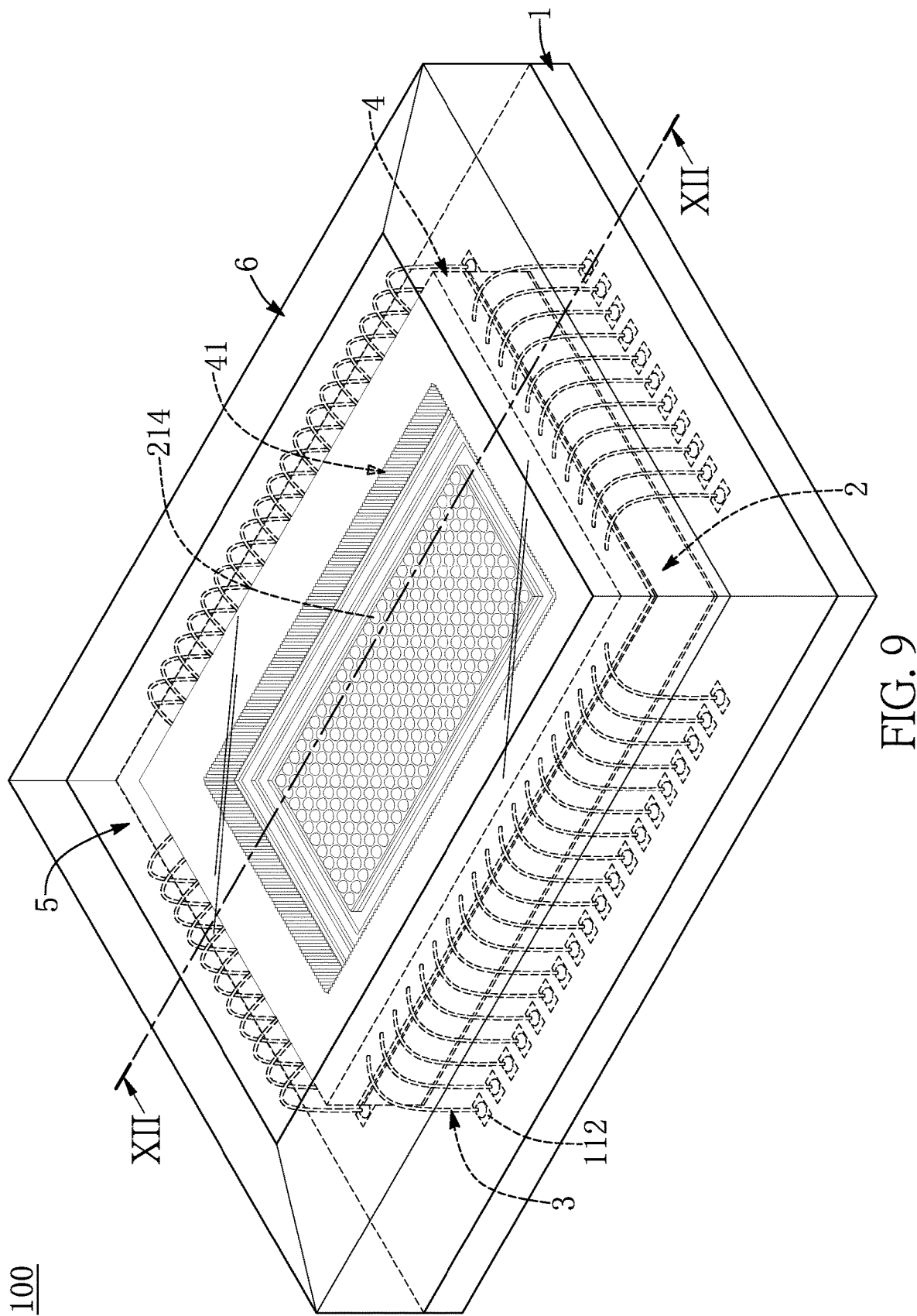
FIG. 9 is a perspective view of the sensor package structure according to a second embodiment of the present disclosure.
Figure 10:
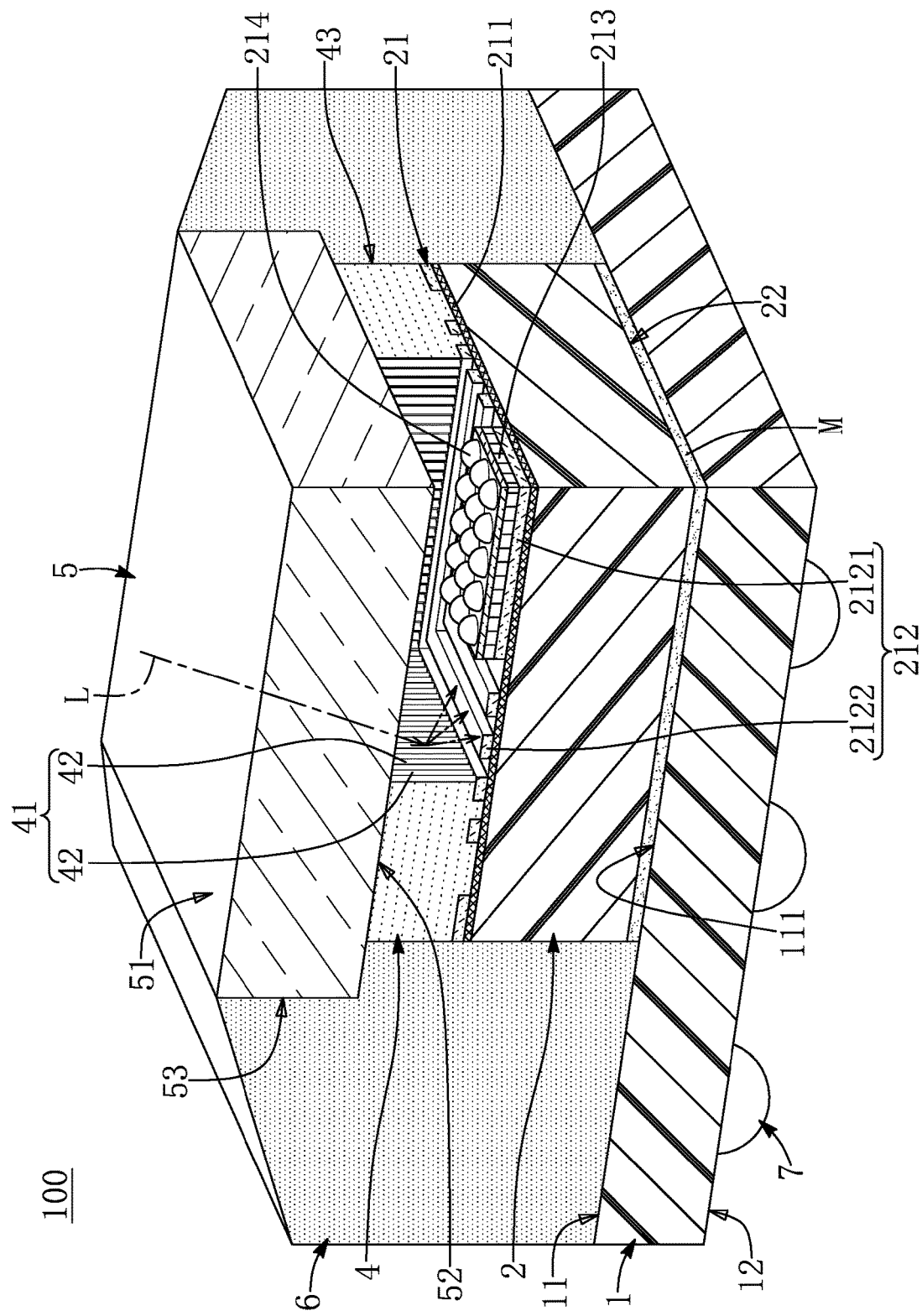
FIG. 10 is a perspective cross-sectional view of FIG. 9.
Figure 11:
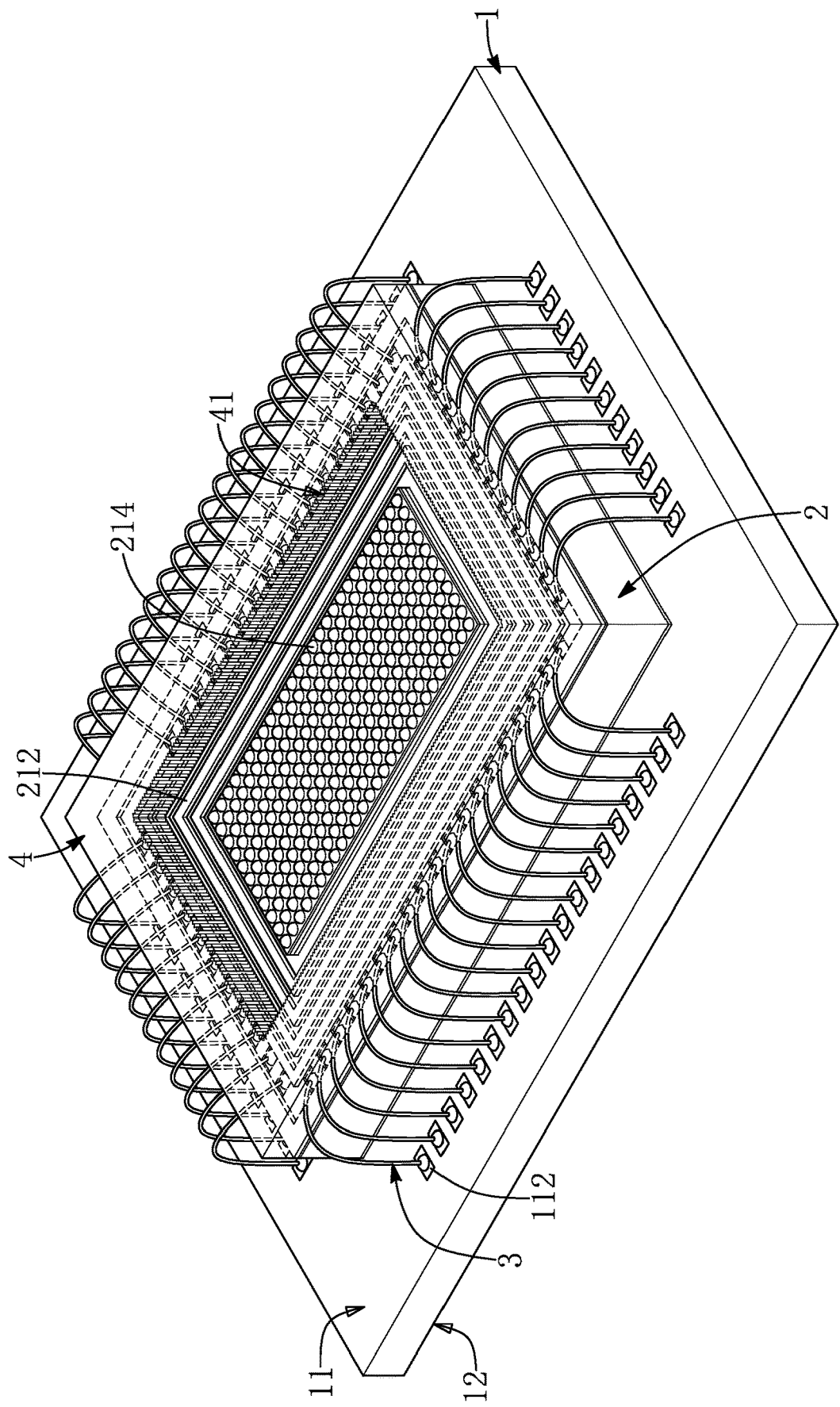
FIG. 11 is a perspective view showing the sensor package structure of FIG. 9 when the light-permeable layer and the encapsulating body are omitted.
Figure 12:
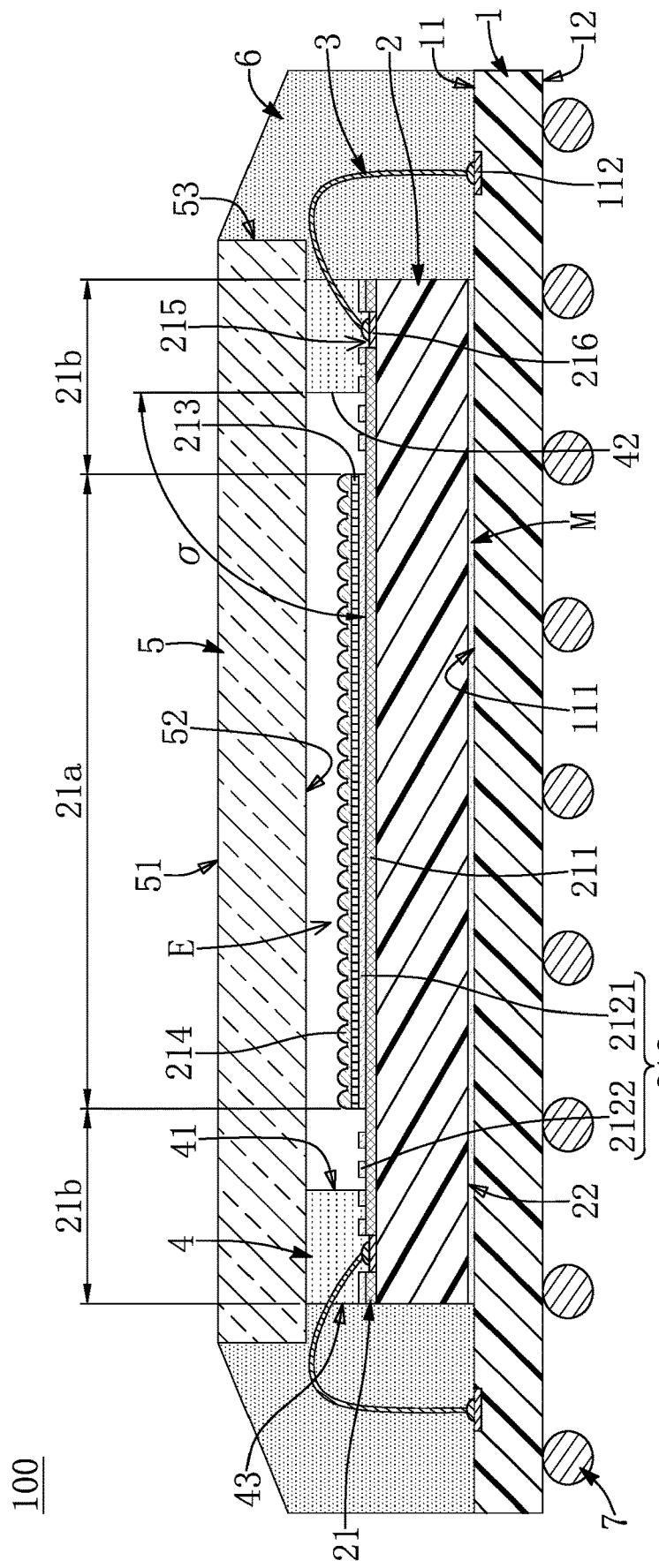
FIG. 12 is a cross-sectional view taken along line XII-XII of FIG. 9.
Figure 13:
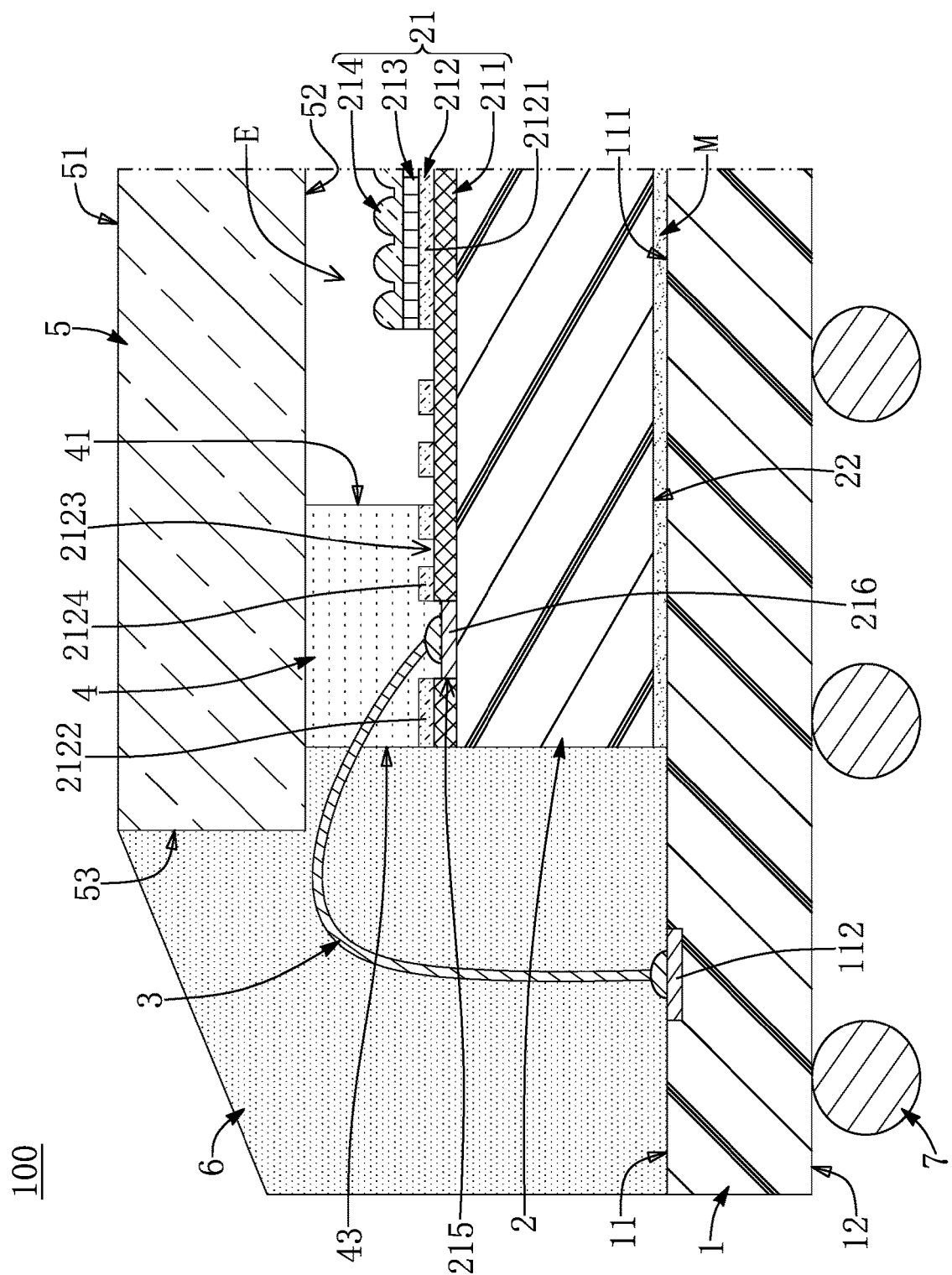
FIG. 13 is an enlarged view of a portion of FIG. 12.

Furthermore, as shown in FIG. 3 and FIG. 4, the ring-shaped support 4 can be arranged inside of the at least one accommodating slot 215; or, as shown in FIG. 8, the ring-shaped support 4 can be disposed on the at least one accommodating slot 215, so that each of the connection pads 216 and a part of the corresponding metal wire 3 connected thereto are embedded in the ring-shaped support 4.

As shown in FIG. 3 to FIG. 5, the light-permeable layer 5 in the present embodiment is a transparent and flat glass board, but the present disclosure is not limited thereto. The light-permeable layer 5 is arranged above the sensor chip 2 through the ring-shaped support 4; in other words, the ring-shaped support 4 is sandwiched between the light-permeable layer 5 and the sensor chip 2. The light-permeable layer 5, the ring-shaped support 4, and the sensor chip 2 jointly and surroundingly define an enclosed space E, and the sensing region 21a (e.g., the central segment 2121 of the color filter layer 212, the pixel layer 213, and the micro-lens layer 214) is arranged in the enclosed space E and faces toward the light-permeable layer 5.

Moreover, the light-permeable layer 5 in the present embodiment includes an outer surface 51, an inner surface 52 opposite to the outer surface 51, and a surrounding lateral surface 53 that is connected to the outer surface 51 and the inner surface 52. The inner surface 52 faces toward the sensing region 21a, and an outer lateral side 43 of the ring-shaped support 4 is arranged inward by a distance from the surrounding lateral surface 53 of the light-permeable layer 5, but the present disclosure is not limited thereto. For example, as shown in FIG. 8, the surrounding lateral surface 53 of the light-permeable layer 5 can be flush with the outer lateral side 43 of the ring-shaped support 4, and each of the connection pads 216 and the part of the corresponding metal wire 3 connected thereto are embedded in the ring-shaped support 4.

As shown in FIG. 3 to FIG. 5, the encapsulating body 6 in the present embodiment is formed on the upper board surface 11 of the substrate 1, and a lateral side of the encapsulating body 6 is flush with that of the substrate 1. The sensor chip 2, the ring-shaped support 4, the light-permeable layer 5, and at least part of each of the metal wires 3 are embedded in the encapsulating body 6, and a surface of the light-permeable layer 5 (e.g., the outer surface 51) is exposed from the encapsulating body 6.

Furthermore, the encapsulating body 6 in the present embodiment is a solidified liquid compound, but the present disclosure is not limited thereto. For example, in other embodiments of the present disclosure not shown in the drawings, the encapsulating body 6 can further include a molding compound formed on a top surface of the solidified liquid compound; or the encapsulating body 6 can be a molding compound.

Second Embodiment

Referring to FIG. 9 to FIG. 13, a second embodiment of the present disclosure is provided, which is similar to the first embodiment of the present disclosure. For the sake of brevity, descriptions of the same components in the first and second embodiments of the present disclosure will be omitted herein, and the following description only discloses different features between the first and second embodiments.

In the present embodiment, the ring-shaped support 4 is a solder mask layer and has a scattering surface 41 that is in a ringed shape and that is arranged on an inner side thereof. The scattering surface 41 has a plurality of zigzag stripes 42 spaced apart from each other. The zigzag stripes 42 of the scattering surface 41 in the present embodiment are in an annular arrangement and are spaced apart from each other by a same interval, but the present disclosure is not limited thereto. For example, in other embodiments of the present disclosure not shown in the drawings, the zigzag stripes 42 can be connected to each other or can be provided in an annular arrangement and spaced apart from each other at different intervals according to design requirements.

Moreover, an angle σ between the scattering surface 41 and the sensing region 21*a* in the present embodiment is 90 degrees, but the present embodiment is not limited thereto. For example, the angle σ can be adjusted within a range from 80 degrees to 100 degrees according to design requirements. In the present embodiment, a longitudinal direction of each of the zigzag stripes 42 is preferably perpendicular to the inner surface 52 of the light-permeable layer 5 (or the top portion 21 of the sensor chip 2).

Accordingly, when light L travels onto the scattering surface 41 at an incidence angle by passing through the light-permeable layer 5 (shown in FIG. 10), the scattering surface 41 (or the zigzag stripes 42) can be configured to disperse the light L into a plurality of lights at angles different from the incidence angle, thereby effectively reducing occurrence of the flare phenomenon occurred in the sensor package structure 100.

Beneficial Effects of the Embodiments

In conclusion, in the sensor package structure provided by the present disclosure, connection between the ring-shaped support and the sensor chip can be reinforced through the color filter layer having the roughened surface, thereby effectively preventing separation between the ring-shaped support and the sensor chip.

Moreover, the ring-shaped support (or the solder mask layer) of the sensor package structure provided by the present disclosure has the scattering surface arranged on the inner side thereof, so that the scattering surface can be configured to disperse light, which travels onto the scattering surface by passing through the light-permeable layer, into a plurality of lights at angles different from the incidence angle, thereby effectively reducing occurrence of the flare phenomenon in the sensor package structure.

Specifically, when the ring-shaped support is the solder mask layer that can be manufactured in a stamping manner, a lithography manner, a printing manner, or a coating manner, the shape of the ring-shaped support (or the shape of the scattering surface) can be accurately formed, thereby effectively reducing occurrence of the flare phenomenon in the sensor package structure.

In addition, the scattering surface of the ring-shaped support (or the solder mask layer) of the sensor package structure provided by the present disclosure can be formed with a specific structural design (e.g., the angle between the scattering surface and the sensing region can be provided within a range from 80 degrees to 100 degrees, the longitudinal direction of each of the zigzag stripes can be perpendicular to the inner surface of the light-permeable layer, or the zigzag stripes of the scattering surface can be spaced apart from each other by the same interval), thereby effectively reducing occurrence of the flare phenomenon in the sensor package structure.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A sensor package structure, comprising:
   a substrate;
   a sensor chip disposed on and electrically coupled to the substrate, wherein a top portion of the sensor chip defines a sensing region and a carrying region that surrounds the sensing region, and wherein the top portion of the sensor chip includes:
      a passivation layer arranged in the sensing region and the carrying region;
      a color filter layer including a central segment arranged in the sensing region and a peripheral segment that is arranged in the carrying region and that has a roughened surface;
      a pixel layer arranged in the sensing region and formed on the central segment; and
      a micro-lens layer arranged in the sensing region and formed on the pixel layer;
   a ring-shaped support formed on the carrying region of the sensor chip, wherein at least part of the peripheral segment of the color filter layer is embedded in the ring-shaped support; and
   a light-permeable layer disposed on the ring-shaped support, wherein the light-permeable layer, the ring-shaped support, and the sensor chip jointly define an enclosed space.

2. The sensor package structure according to claim 1, wherein the color filter layer has a plurality of ring-shaped slots that are recessed in the peripheral segment so as to form the roughened surface, and wherein each of the ring-shaped slots surrounds the central segment, and at least one of the ring-shaped slots is fully filled with the ring-shaped support.

3. The sensor package structure according to claim 2, wherein each of the ring-shaped slots penetrates through the peripheral segment, so that the peripheral segment is divided into a plurality of ring-shaped ribs spaced apart from each other, and the ring-shaped support is connected to the passivation layer by passing through at least one of the ring-shaped slots.

4. The sensor package structure according to claim 2, wherein center points of the ring-shaped slots overlap with each other.

5. The sensor package structure according to claim 1, wherein the peripheral segment of the color filter layer has a plurality of protrusions that are spaced apart from each other so as to form the roughened surface, and wherein the protrusions are arranged around the central segment, and at least part of the protrusions are embedded in the ring-shaped support.

6. The sensor package structure according to claim 1, wherein the ring-shaped support is a solder mask layer and has a scattering surface that is in a ringed shape and that is arranged on an inner side thereof, and wherein, when light travels onto the scattering surface at an incidence angle by passing through the light-permeable layer, the scattering surface is configured to disperse the light into a plurality of lights at angles different from the incidence angle.

7. The sensor package structure according to claim 6, wherein the scattering surface has a plurality of zigzag stripes spaced apart from each other, and a longitudinal direction of each of the zigzag stripes is perpendicular to an inner surface of the light-permeable layer.

8. The sensor package structure according to claim 1, wherein the substrate includes a plurality of bonding pads arranged outside of the sensor chip, and the sensor chip includes a plurality of connection pads arranged in the carrying region, and the sensor package structure includes a plurality of metal wires, and wherein one end of each of the metal wires is connected to one of the bonding pads, and another end of each of the metal wires is connected to one of the connection pads.

9. The sensor package structure according to claim 8, wherein the sensor chip has at least one accommodating slot that is recessed in the carrying region and that penetrates through the peripheral segment and the passivation layer, and wherein the connection pads are located in the at least one accommodating slot.

10. The sensor package structure according to claim 1, further comprising an encapsulating body formed on the substrate, wherein the sensor chip, the ring-shaped support, and the light-permeable layer are embedded in the encapsulating body, and a surface of the light-permeable layer is exposed from the encapsulating body.

\* \* \* \* \*